(12) United States Patent
Aritome

(10) Patent No.: US 8,050,096 B2
(45) Date of Patent: *Nov. 1, 2011

(54) PROGRAMMING METHOD TO REDUCE GATE COUPLING INTERFERENCE FOR NON-VOLATILE MEMORY

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/702,688

(22) Filed: Feb. 9, 2010

(65) Prior Publication Data
US 2010/0142268 A1    Jun. 10, 2010

Related U.S. Application Data

(63) Continuation of application No. 12/142,293, filed on Jun. 19, 2008, now Pat. No. 7,660,158, which is a continuation of application No. 11/355,830, filed on Feb. 16, 2006, now Pat. No. 7,400,532.

(51) Int. Cl.
*G11C 16/04* (2006.01)
(52) U.S. Cl. .......... 365/185.17; 365/185.03; 365/185.18
(58) Field of Classification Search ............. 365/185.17, 365/185.03, 185.18, 185.23, 185.24
See application file for complete search history.

(56) References Cited

U.S. PATENT DOCUMENTS

| | | | |
|---|---|---|---|
| 5,528,547 A | 6/1996 | Aritome et al. | |
| 6,975,542 B2 | 12/2005 | Roohparvar | |
| 6,977,842 B2 | 12/2005 | Nazarian | |
| 6,982,905 B2 | 1/2006 | Nguyen | |
| 7,072,219 B1 | 7/2006 | Yeh | |
| 7,187,585 B2 * | 3/2007 | Li et al. | 365/185.2 |
| 7,206,235 B1 | 4/2007 | Lutze et al. | |
| 7,254,064 B2 | 8/2007 | Kim et al. | |
| 7,286,406 B2 * | 10/2007 | Lutze et al. | 365/185.18 |
| 7,400,532 B2 | 7/2008 | Aritome | |
| 7,660,158 B2 * | 2/2010 | Aritome | 365/185.17 |
| 2004/0109361 A1 | 6/2004 | Eby et al. | |

* cited by examiner

*Primary Examiner* — Gene N. Auduong
(74) *Attorney, Agent, or Firm* — Leffert Jay & Polglaze, P.A.

(57) ABSTRACT

A non-volatile memory device and programming process is described that compensates for coupling effects on threshold gate voltages of adjacent floating gate or non-conductive floating node memory cells by adjusting the threshold voltage level programmed in view of the data being programmed on a following programming cycle into adjacent memory cells, so that the coupling effect results in the desired target threshold voltages for the cells. In one embodiment of the present invention, memory cell coupling is compensated for by adjusting programming level of one or more memory cells of a first page a memory array to a higher or lower threshold verify target voltage given the data/programming level to be written to directly adjacent memory cells of a second page, so that coupling between the directly adjacent memory cells of the first and second pages brings the memory cells of first page to their final target programming level.

20 Claims, 9 Drawing Sheets

PROGRAMMING METHOD TO REDUCE GATE COUPLING INTERFERENCE FOR NON-VOLATILE MEMORY

RELATED APPLICATIONS

This application is a continuation of U.S. application Ser. No. 12/142,293, filed Jun. 19, 2008 now U.S. Pat. No. 7,660,158, titled "PROGRAMMING METHOD TO REDUCE GATE COUPLING INTERFERENCE FOR NON-VOLATILE MEMORY" (allowed), which is a continuation of application Ser. No. 11/355,830, filed Feb. 16, 2006, now U.S. Pat. No. 7,400,532, issued Jul. 15, 2008, which are commonly assigned and incorporated herein by reference.

TECHNICAL FIELD OF THE INVENTION

The present invention relates generally to memory devices and in particular the present invention relates to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. For example, a tunnel oxide that is formed between the floating gate/node and the channel region. A control gate is located over the floating gate/node and is typically made of doped polysilicon or metal. The control gate is electrically separated from the floating gate/node by another dielectric layer. Thus, the floating gate or charge trapping layer/floating node is "floating" in dielectric so that it is insulated from both the channel and the control gate. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET (such as in certain SONOS devices or so called "NROM" devices).

A problem in programming non-volatile memory devices is that memory cells can be capacitively coupled during the programming of adjacent cells of the row or the programming of memory cells of adjacent word lines or rows, interfering with or even program disturbing the coupled memory cell and inadvertently changing its stored charge and threshold voltage level. This is particularly an issue in modern NAND architecture Flash memory devices where the smaller memory cell separation and cell pitch can increase this coupling effect. In addition, the effect of cell to cell coupling is likely to continue to worsen with future manufacturing process improvements that will further reduce feature sizes and cell separation and in Flash memory and other non-volatile memory devices that utilize low operating voltages single level cells (SLCs) or multi-level cells (MLCs) that have narrow logic separation windows between their differing logic states.

For the reasons stated above, and for other reasons stated below which will become apparent to those skilled in the art upon reading and understanding the present specification, there is a need in the art for alternative methods of programming Flash memory arrays.

DETAILED DESCRIPTION

Figure 1:
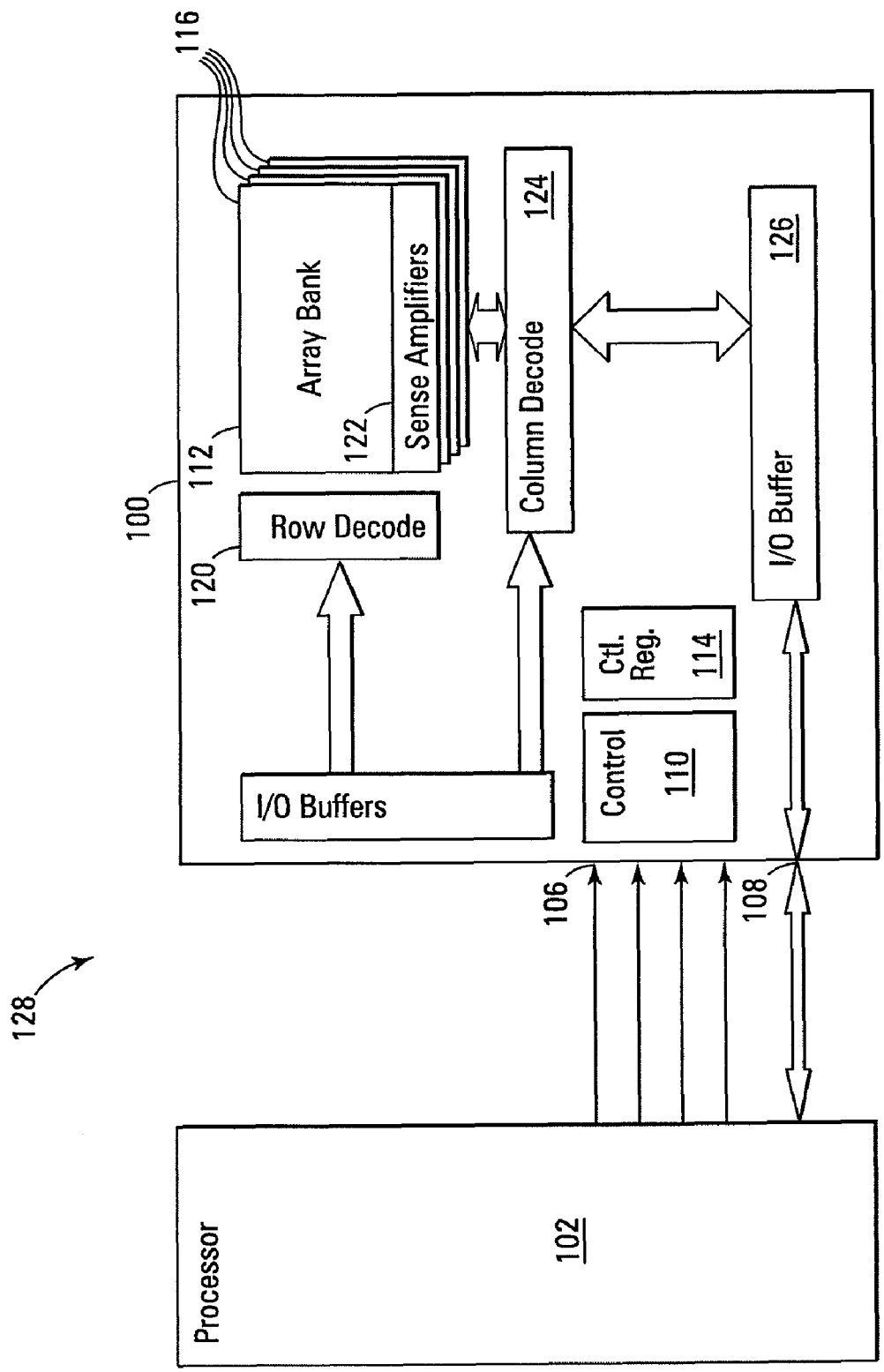
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include non-volatile memory devices and arrays that compensate for the capacitive coupling effects on programmed threshold gate voltages of adjacent floating gate or non-conductive floating node memory cells by adjusting the threshold voltage level programmed into a memory cell in view of the coupling ratio and the data/threshold value being programmed on a following programming cycle into an adjacent memory cell, so that the coupling effect between the cells results in the desired target threshold voltages for the cells. In one embodiment of the present invention, memory cell to memory cell coupling is compensated for by adjusting programming level of a first memory cell given the data/programming level to be written in a second programming operation to an adjacent second memory cell of the memory array so that coupling between the adjacent memory cells will bring the first memory cell to its final targeted programming level for the data stored in first memory cell. In another embodiment of the present invention, memory cell to memory cell coupling is compensated for by adjusting programming level of one or more memory cells of a first page or row of a memory array or non-volatile memory device to a higher or lower threshold verify target voltage given the data/programming level to be written to directly adjacent memory cells of a second page, so that coupling between the directly adjacent memory cells of the first and second pages brings the one or more memory cells of first page to their final target programming level.

Common programming technique for non-volatile floating gate or floating node memories programs a bit or row (commonly referred to as a page) of the memory by applying a programming voltage or series of programming voltage pulses to the control gates of the selected memory cells and programming or inhibiting the selected memory cells to either program (set at logical "0" by the injection of charge to the floating gate or floating node of a memory cell) or inhibit (not program, usually intended to leave the cell erased and set at logical "1") by coupling their channels to either a program or inhibit voltage. As stated above, because of cell to cell coupling, the elevated programming voltage coupled to the control gates of memory cells can have the undesired effect of altering the threshold voltages in adjacent memory cells. This can cause threshold voltages to be moved out of their specified logic windows, particularly in modern low voltage or multi-level cells, and thereby corrupt the stored data.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown).

Memory access addresses are received on the address/data interface 108 of the non-volatile memory 100 and divided into a row and column address portions. On a read access, the row address is latched and decoded by row decode circuit 120, which selects and activates a row page (not shown) of memory cells. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). The column address of the access is latched and decoded by the column decode circuit 124. The output of the column decode circuit selects the desired column data from the sense amplifier outputs and connected to the data buffer 126 for transfer from the memory device through the address/data interface 108.

On a write access, the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

Two common types of non-volatile or Flash memory array architectures are the "NAND" and "NOR" architectures, so called for the resemblance which the basic memory cell configuration of each architecture has to a basic NAND or NOR gate circuit, respectively. In the NOR array architecture, the memory cells of the memory array are arranged in a matrix of rows and columns similar to conventional RAM or ROM. The gates of each non-volatile memory cell of the array matrix are coupled by rows to word select lines (word lines or WLs) and their drains are coupled to column bit lines. The source of each memory cell is typically coupled to a common source line. The NOR architecture floating gate or floating node/charge trapping memory array is accessed by a row decoder activating a row of memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

A NAND memory array architecture also arranges its array of non-volatile memory cells in a matrix such that the gates of each memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate, greater cell to cell coupling, and programming complexity.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

It is noted that embodiments of the present invention are not limited to NAND or NOR architecture memory arrays or memory devices and can apply to other block erasing memory array architectures and memory devices, including, but not limited to, AND and virtual ground architecture memory arrays and memory devices.

Figure 2A:
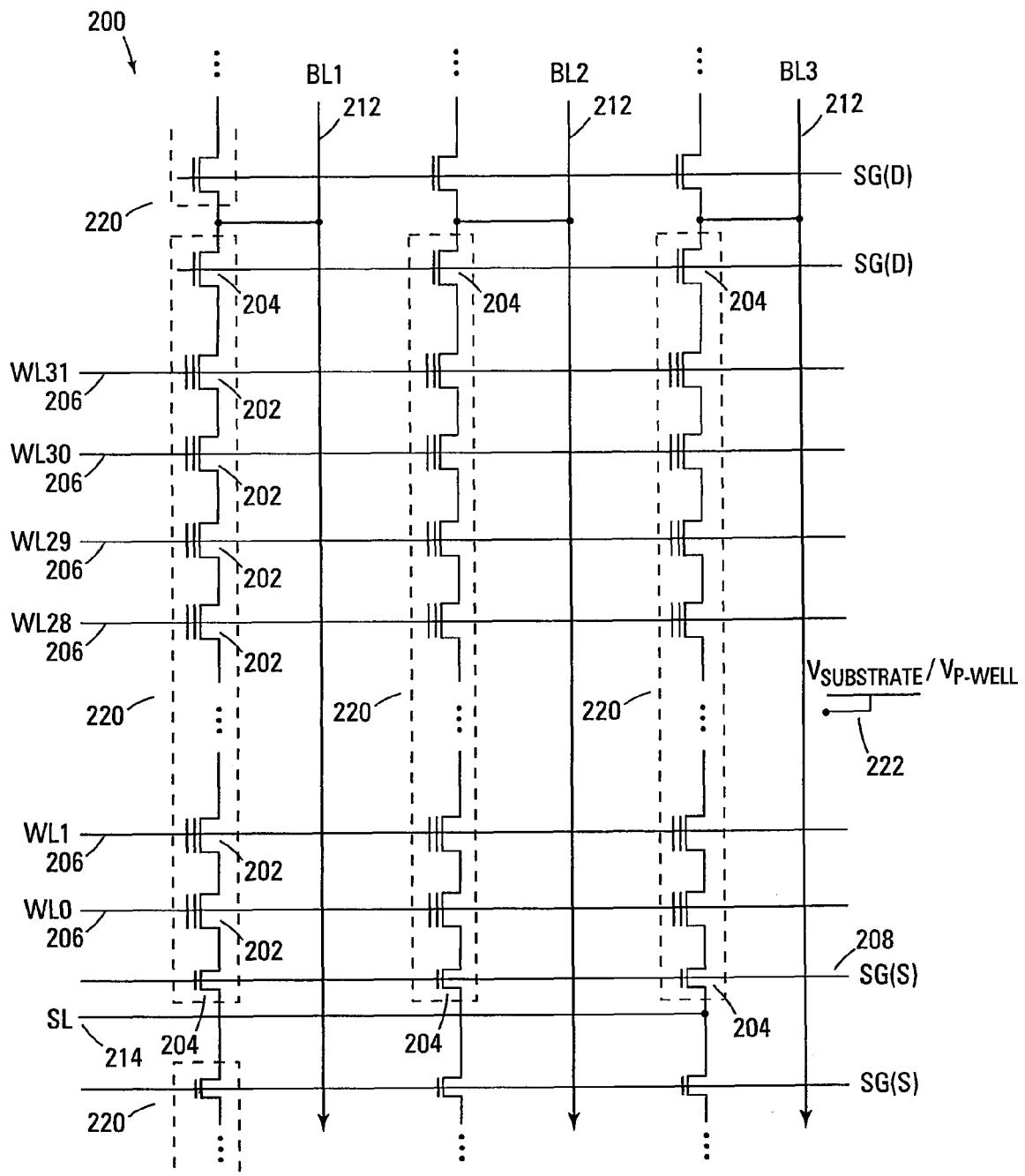
FIGS. 2A and 2B are simplified block diagrams of NAND and NOR architecture Flash memory arrays in accordance with an embodiment of the present invention.
Figure 2B:
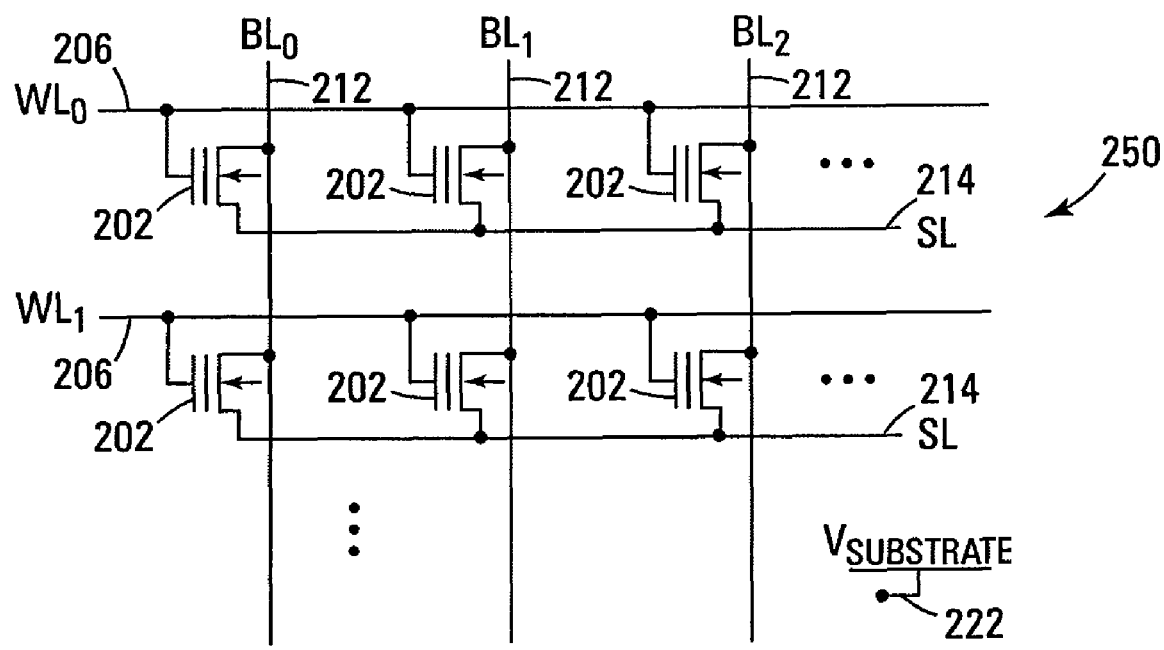

FIGS. 2A and 2B show schematics of a simplified NOR and NAND architecture floating node or trapping layer memory array 200, 250 of a Flash memory device of an embodiment of the present invention. It is noted that the memory arrays 200, 250 of FIGS. 2A and 2B are for illustrative purposes and should not be taken as limiting and that other memory array embodiments of the present invention are possible and will be apparent to those skilled in the art with the benefit of the present disclosure.

In FIG. 2A, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, each NAND architecture memory string 220 of the memory is formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2A, the substrate connection 222 is shown coupled to each NAND string 220, allowing the memory cells 202 of each NAND string 220 to be biased for erasure.

FIG. 2B details a simplified NOR floating gate/node memory array 250 of a Flash memory device embodiment of the present invention. In FIG. 2B, floating gate/node memory cells 202 are coupled together in a NOR architecture memory array having bit lines 212, source lines 214, word lines 206, and substrate connection 222. Each floating gate memory cell 202 has a floating gate or floating node/charge trapping field effect transistor (FET) comprising a gate-insulator stack formed between drain and source regions that are coupled to a bit line 212 and a source line 214, respectively.

As stated above, common programming technique for non-volatile memories or Flash memories programs a bit or page of data (where one or more pages can be contained in a row of a memory array) of the memory by applying a programming voltage or series of programming voltage pulses to the control gates of the selected memory cells and programming or inhibiting the selected memory cells to either program (set at logical "0" by the injection of charge to the floating gate or floating node of a memory cell) or inhibit (not program, usually intended to leave the cell erased and set at logical "1") by coupling their channels to either a program or inhibit voltage.

In programming a page of memory cells in a NOR architecture Flash/EEPROM memory array, a programming voltage is typically coupled to the word lines coupled to the gates of the selected memory cells of the page. The memory cells are also coupled to a bit line or source line that has a channel program or program-inhibit voltage placed upon it. This applies a field across the page of memory cells selected for programming that causes carriers to tunnel to the floating gate or charge trapping layer, altering the threshold voltage level (Vt) of the selected memory cell and storing the data value. If a program-inhibit voltage placed upon the coupled bit lines or source lines, the applied field is not sufficient to tunnel carriers to the floating gate/nodes of the memory cells and no data value is programmed, the memory cell remaining in the prior or erased state.

In programming a page of memory cells in a NAND architecture Flash/EEPROM memory array, a programming voltage is typically coupled to word lines coupled to the gates of the selected memory cells of the page, each memory cell typically in a different memory string of the array. In addition, the word lines coupled to the gates of the unselected memory cells of each string are also driven by a pass gate voltage (Vpass) so as to operate them as pass transistors, generating a channel of carriers by capacitive coupling in the unselected memory cells and allowing them to pass current in a manner that is relatively unrestricted by their stored data values. The memory strings are then typically coupled to a bit line or source line that has a program or program-inhibit voltage placed upon it. As stated above, the applied pass voltage, Vpass, also allows generation of a channel of carriers in the memory string and allows the memory cell that was selected for programming in each string to couple through this channel of carriers to the bit line or the source line. This applies a field across the selected memory cell of each string that causes carriers to tunnel to the floating gate or charge trapping layer, altering the threshold voltage level (Vt) of the selected memory cell and storing the data value. If a program-inhibit voltage placed upon the coupled bit line or source line, the applied field is not sufficient to tunnel carriers to the floating gate/node, no data value is programmed and the memory cell remains in the erased state.

After programming the selected page of memory cells in both NAND and NOR architecture Flash memory, a verify operation is then performed to confirm that the data was successfully programmed. If one or more memory cells of the programmed page fails verification, the program and verify cycle is repeated until the data is successfully programmed or a selected number of iterations have passed and the programming operation is deemed to have failed.

It is noted that a programming cycle is also utilized in erase operations in block based non-volatile memories. In block erasure, the block selected for erasure is typically erased with a series of high voltage erase pulses. The contents of the newly erased block are then read to verify that they were completely erased and soft programmed to "heal" any over-erased memory cells. Data comparison is used during the verification portion of this erase cycle to confirm that the memory cells of each row of the erase block has been completely erased and that no further erase pulses are required. Verification is then typically used to locate and mark any bad rows or sectors of the array so that they are not used.

A page of data is typically defined as the number of columns of data that can be read from the memory array with a single open page operation. Pages are usually sequentially addressed within the array. The page open operation is generally accomplished with the initial "ACTIVE" command of the two command sequence of a synchronous memory read or write operation (or the RAS command in an asynchronous memory), which activates the selected row and couples the memory cells to the sense amplifiers to be read or written. The ACTIVE command is then followed by a "READ" or "WRITE" command (or the CAS command combined with WE in an asynchronous memory) that selects the data word to be read or written to or from the columns of the open page or indicates the selected starting data word of a multi-word read or write burst.

As stated above, many modern non-volatile memory devices have one or more pages of data contained on each row of the memory array. In typically in these cases the array will also have multiple bit lines per sense amplifier that are selectively coupled to the sense amplifier depending on the page being opened. For example in a two page per row array each sense amplifier will have even and odd bit lines that run side by side through the array and are selectively coupled to the array depending on whether the even or odd numbered page of the row of the array is selected.

Programming and reading pages within an array is typically done in a sequential fashion, with a lower addressed page generally being read or written before a higher addressed page. In programming and reading multi-page per row, since there are multiple pages per row, the pages are generally programmed or read from lowest addressed to highest within the row, the same pattern is repeated on higher addressed rows as required.

As stated above, a problem in programming non-volatile memory devices is that memory cells can capacitively couple to each other during the programming of adjacent cells of the row or the programming of memory cells of adjacent word lines or rows, program disturbing or interfering with the coupled memory cell and inadvertently changing its stored charge and threshold voltage level. This is particularly an issue in modern NAND architecture Flash memory devices where the smaller memory cell separation and cell pitch can increase this coupling effect. The coupling effects are typically highest in memory cells that are directly adjacent to each other within the row or column (X-axis or Y-axis) orientation of the memory array. Coupling effects are also an issue in Flash memory and other non-volatile memory devices that utilize reduced feature size, low operating voltage single level cells (SLCs) or multi-level cells (MLCs) that utilize a narrow logic separation window of programmed threshold voltage between different logic states.

In programming memory cells, target threshold voltage ranges within defined "logic windows" are utilized to define differing stored logic states in the floating gate or floating node memory cell. When a page of memory cells are programmed or erased the threshold voltage levels of the cells of the page are altered in iterating programming and verify cycles (or erase and verify cycles) until the threshold voltages of the memory cells verify within the desired logic window for the data state. Typically, in multi-level cells (MLCs), a series of different threshold voltage level (Vth) ranges/logic windows are defined to indicate the differing stored data states within the cell (such as, a different Vth range for each of 00, 01, 10, and 11 bit states for a two data bit MLC). Program disturb or interference occurs when the threshold voltage level of a cell is pushed outside the Vth range/logic window for its stored data value by the coupled programming voltage being applied to an adjacent memory cell/word line. Because of this, as noted above, program disturb or interference is a particular issue with multi-level cells (MLCs) with their multiple Vth ranges/logic windows.

As stated above, embodiments of the present invention compensate for memory cell to memory cell coupling in order to reduce the impact on stored data values by adjusting programming level of a first memory cell given the data/programming level to be written at a later time to second adjacent memory cell of the memory array so that coupling between the adjacent memory cells will bring the first memory cell to its final targeted programming level for the data stored in first memory cell. In one embodiment, the capacitive coupling effects between adjacent floating gate or non-conductive floating node memory cells is compensated for by programming a first memory cell to a lower threshold gate voltage if a second adjacent memory cell is also to be programmed so that, when the second memory cell is programmed, the threshold gate voltage of the first memory cell is raised through coupling to be within the target threshold voltage range for the data that is stored in it. In another embodiment of the present invention, memory cell to memory cell coupling is compensated for by adjusting programming level of one or more memory cells of a first page or row of a memory array or non-volatile memory device to a higher or lower threshold verify target voltage given the data/programming level to be written to directly adjacent memory cells of a second page, so that coupling between the directly adjacent memory cells of the first and second pages brings the one or more memory cells of first page to their final target programming level. In yet another embodiment, the capacitive coupling effects between adjacent multi-level floating gate/node memory cells (MLCs), that store two or more bits of data in a single memory cell through the use of multiple threshold voltage levels or through charge storage centroids on a non-conductive floating node is compensated for by programming a first memory cell to a lower threshold gate voltage if a second adjacent memory cell is also to be programmed. In a further embodiment, in a non-volatile memory device having multiple pages of memory per row of the memory array (such as an array having even and odd bit lines running side by side through the array), memory cell to memory cell coupling is compensated for by adjusting programming level of one or more memory cells of a first page of the memory array to a higher or lower threshold verify target voltage given the data/programming level to be written to memory cells of a second page that is directly adjacent in a X (within the row) or Y (in the following row) orientation within the memory array, so that coupling between the directly adjacent memory cells of the first and second pages brings the one or more memory cells of first page to their final target programming level.

FIGS. 3A-6 illustrate typical array programming operations and interference compensation of various embodiments of the present invention. It is noted that although the programming operations described in FIGS. 3-6 are described in reference to NAND architecture memory arrays it noted that the descriptions are for illustrative purposes and that the embodiments are applicable to the programming of other non-volatile memory array architectures and should not be taken as limiting.

Figure 3B:
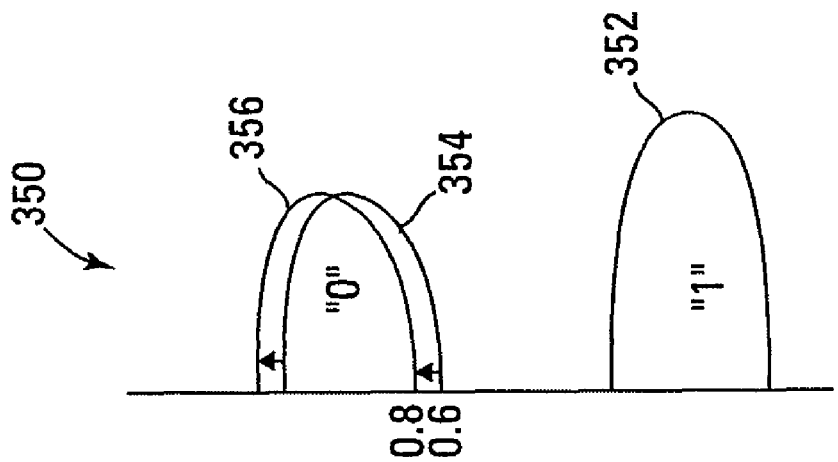
FIGS. 3A and 3B detail programming operations in a non-volatile memory array in accordance with embodiments of the present invention.
Figure 3A:
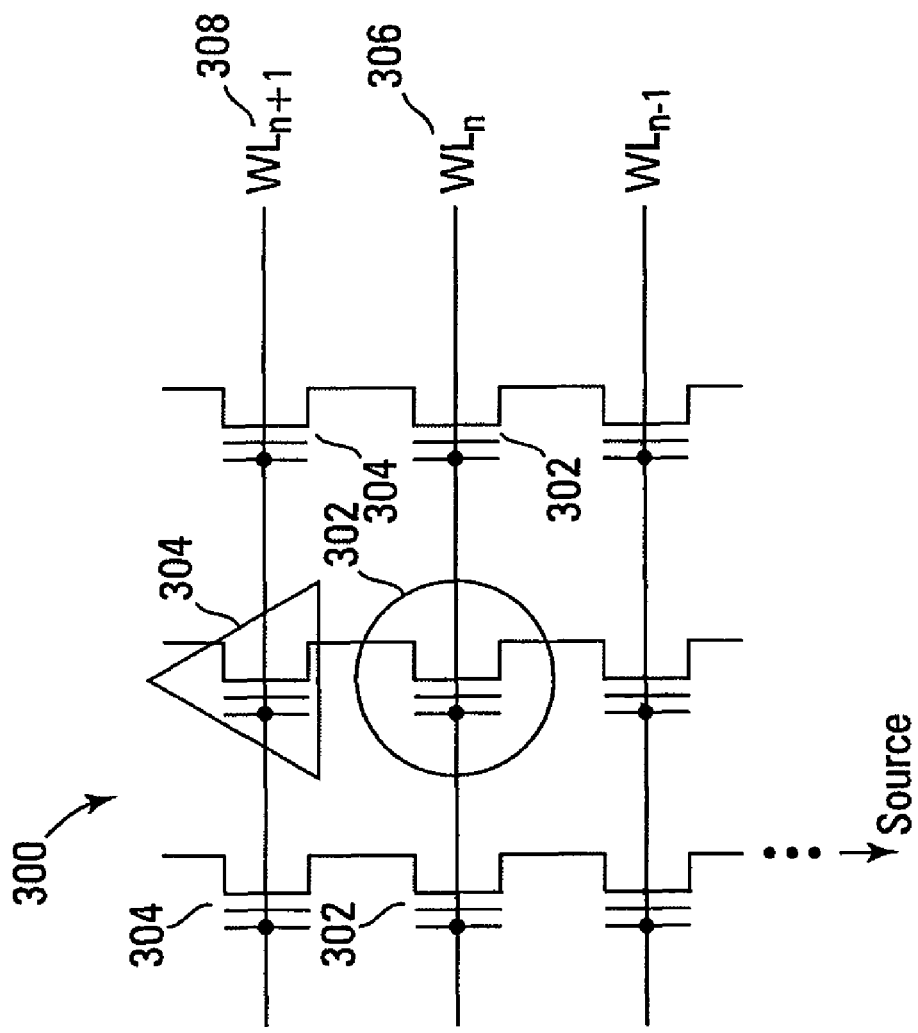

FIGS. 3A and 3B illustrate an example of a programming operation utilizing coupling compensation in accordance with an embodiment of the present invention. In FIG. 3A, the threshold voltages (Vth) programmed into a first row 306 of memory cells 302 coupled to word line WLN of a NAND architecture memory array 300 of an embodiment of the present invention are selected based on the data to be programmed into a second row 308 of memory cells 304 coupled to word line WLN+1. When the second row 308 of memory cells 304 is then programmed, the coupling between adjacent memory cells 302, 304 of the first and second rows 306, 308 will adjust the threshold voltages of the programmed memory cells of the first row 306 to the final target threshold voltage values (within the logic window) for data values stored.

As stated above, in non-volatile memory devices and arrays that utilize floating gate or floating node memory cells, cells are typically erased into low threshold voltage level representing a logical "1" state and, when programmed, the threshold voltages of select memory cells of a page and/or row of memory are altered by the injection of a charge into the floating gate/node raising the threshold voltage to a logical "0" state. In a typical multi-level cell, the erased state is a logical "11" state that is changed in one or two programming operations to a threshold voltage within logical windows representing a logical "10", "10", or "00" state when programmed. Interference of adjacent memory cells generally occurs when a selected memory cell is programmed to alter its threshold voltage from the erased state and typically has the effect of inadvertently injecting additional charge into the adjacent memory cell that was not selected and altering its threshold voltage.

Compensating for this inadvertent charge injection in the adjacent memory cell via coupling interference can be accomplished by lowering the threshold voltage of the adjacent memory cell. Adjacent memory cells that are in the erased state can be altered to a lower erased state threshold voltage during erasure. Adjacent memory cells that are in the programmed state can be programmed to a lower threshold voltage, which is then adjusted upwards by the coupling interference. It is also noted however that in many cases the logical window for the erased state threshold voltage is much larger than that of the programmed state and therefore, generally more immune to disturb than the programmed state. The coupling ratio is typically dependent on the design and materials of the memory cells and the memory array and dictates the amount that the threshold voltages of adjacent memory cells should be adjusted to compensate. As such, the coupling ratio can be determined from the design and/or characterized during manufacture. Coupling ratio characterization of a memory is typically done on a design or "stepping" basis or, for a precise match, on an individual memory die. The coupling ratio is also higher between memory cells of an array that are directly adjacent to each other. In an array, this typically means that the coupling is higher, and therefore coupling interference more significant, between memory cells that are directly adjacent to each other in on the X-axis (cells adjacent within the row) or Y-axis (cells adjacent within a column) directions and is less significant in cells that are displaced from each other or only adjacent on the diagonal.

FIG. 3B details the threshold voltage ranges 350 and the adjustment of the programmed state threshold voltages 354, 356 of the first row 306 of single level memory cells (SLCs) 302, 304 of the memory array 300 embodiment of FIG. 3A. In FIG. 3B, memory cells 302, 304 are initially erased into the erased threshold voltage state 352 (logical state "1", a slightly negative voltage). When the row is programmed, the threshold voltages of a row 306 (or page) of memory cells 302 that are placed into the programmed state (and not inhibited and left in an erased state) are altered to either a higher (such as 0.8V) 356 or a lower (such as 0.6V) 354 threshold voltage, depending on whether a directly adjacent (or non-directly adjacent) memory cell 304 of the following row 308 is also to be altered to a programmed state on the following programming operation. When the adjacent memory cells 304 of the following row 308 are then programmed at a later time, the memory cells 302 of the initial row 304 will also be altered through coupling to the final target (such as 0.8V, representing logical "0") threshold voltage level.

Figure 4:
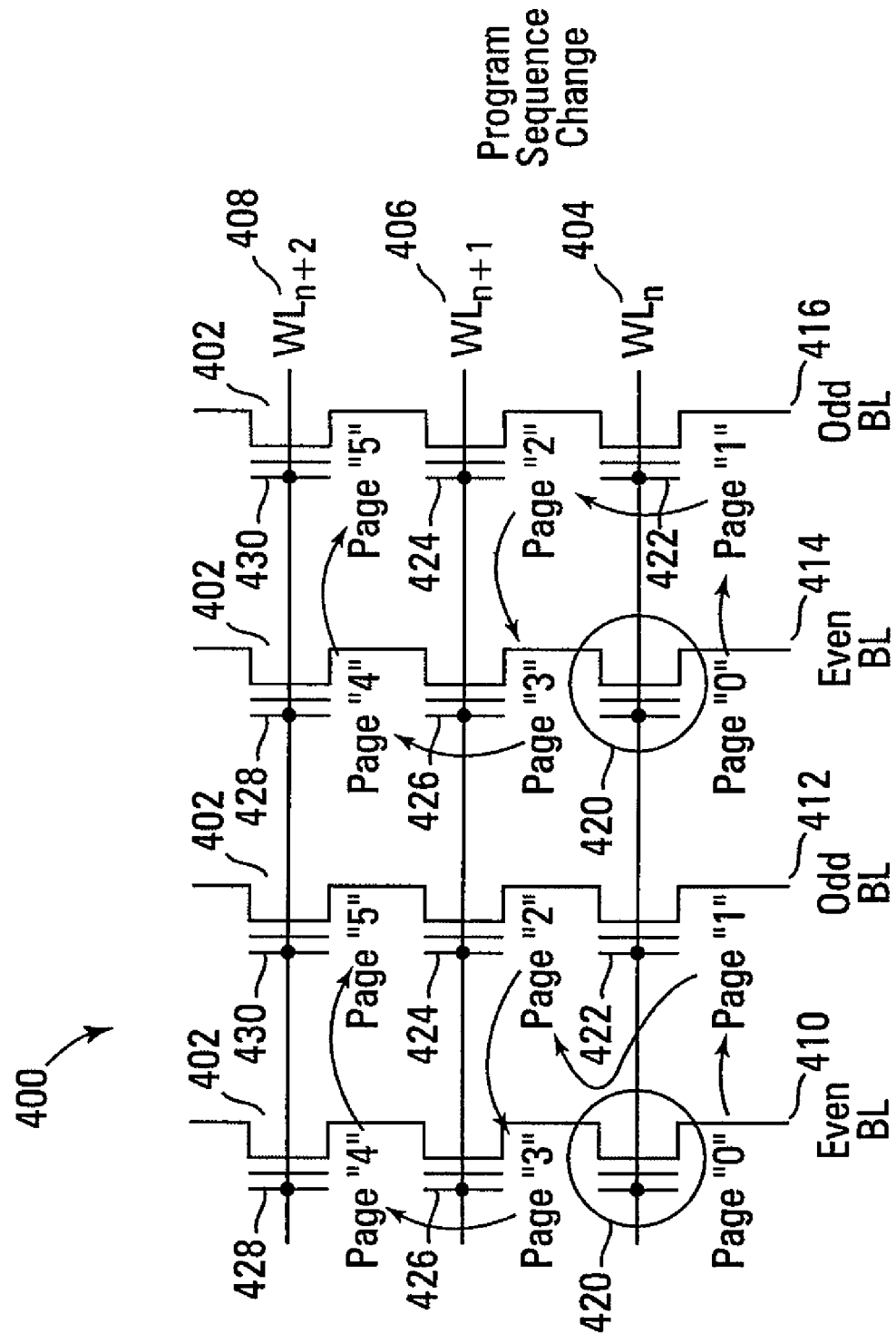
FIG. 4 details programming operations in a non-volatile memory array having multiple pages per row in accordance with embodiments of the present invention.

FIG. 4 illustrates an example of a programming operation in a non-volatile memory array 400 having multiple pages per row utilizing coupling compensation in accordance with an embodiment of the present invention. In FIG. 4, the array 400 contain non-volatile memory cells 402 arranged in rows 404, 406, 408 and columns 410, 412, 414, 416 and having two pages (a page on the even bit lines 410, 414 and a page on the odd bit lines 412, 416) in each row. As there are multiple pages contained in each row, major coupling interference effects can occur in both within the row (the X-axis) and in the column (from row to row, or Y-axis), whereas in the embodiment of FIG. 3, with a single page per row, the major coupling effects were mainly row to row (column direction or Y-axis). The page address/programming sequence of the memory array embodiment 400 of FIG. 4 transitions in an alternating "S" pattern between the even bit line 410, 414 and the odd bit line 412, 416 so that the next memory cell/page to be sequentially addressed/programmed is always directly adjacent to the previously addressed/programmed page (sequentially writing the pages of the row from the first page to the last page and then reversing and writing the last to first page of the next row, and so on). This minimizes circuit complexity, the amount of required input buffer/latches space, and allows for ease of compensating the threshold voltage level of the current page as the data for the next page is generally already latched in the input buffer/data latch for the next programming operation. For example, Page 0 420 (Even BL 410, 414, WLN 404), Page 1 422 (Odd BL 412, 416, WLN 404), Page 2 424 (Odd BL 412, 416, WLN+1 406), Page 3 426 (Even BL 410, 414, WLN+1 406), Page 4 428 (Even BL 410, 414, WLN+2 408), Page 5 430 (Odd BL 412, 416, WLN+2 408), etc. It is noted that in multiple page per row embodiments of the present invention coupling interference can also be compensated multiple write operations out/pages out, such as from page 0 420 to page 3 426 (which is also directly adjacent in the alternating "S" programming pattern, but are out of direct sequence as page 3 426 is programmed on the return loop of the "S" while page 0 420 is programmed in the initial write operation). However, this requires increased circuit complexity (to compensate for multiple disturb events) and additional input buffer/data latch space. The additional input buffer/latches are utilized to hold the four future write operations/pages of data required to allow page 0 420 to be compensated for page 3's 426 data and page 2 424 with page 5's 430.

In prior art memory arrays with multiple pages per row, the page programming sequence is typically a reversed "Z" pattern, sequentially writing the pages of the row from the first page to the last page (even bit lines/page 0 and odd bit lines/page 1 in FIG. 4) and then returning to write the first page of the next row. For example, Page 0 420 (Even BL 410, 414, WLN 404), Page 1 422 (Odd BL 412, 416, WLN 404), Page 3 426 (Even BL 410, 414, WLN+1 406), Page 2 424 (Odd BL 412, 416, WLN+1 406), Page 4 428 (Even BL 410, 414, WLN+2 408), Page 5 430 (Odd BL 412, 416, WLN+2 408), etc. It is also noted that, while such a prior art programming sequence is not optimal for coupling compensation, as write operations are sequenced so that that the next memory cell/page to be sequentially addressed/programmed are not always directly adjacent to the previously addressed/programmed page. However, this prior art page write sequence can also be compensated for memory cell to memory cell coupling utilizing embodiments of the present invention. It is further noted, however, that this coupling compensation in the prior art programming sequence, because of its pattern, would benefit from compensation utilizing additional input buffer/latches are utilized to hold the three future write operations/pages of data that would be required to allow page 0 420 to be compensated for page 3's 426 data, page 1 412 with page 2's 424, etc.

Figure 5A:
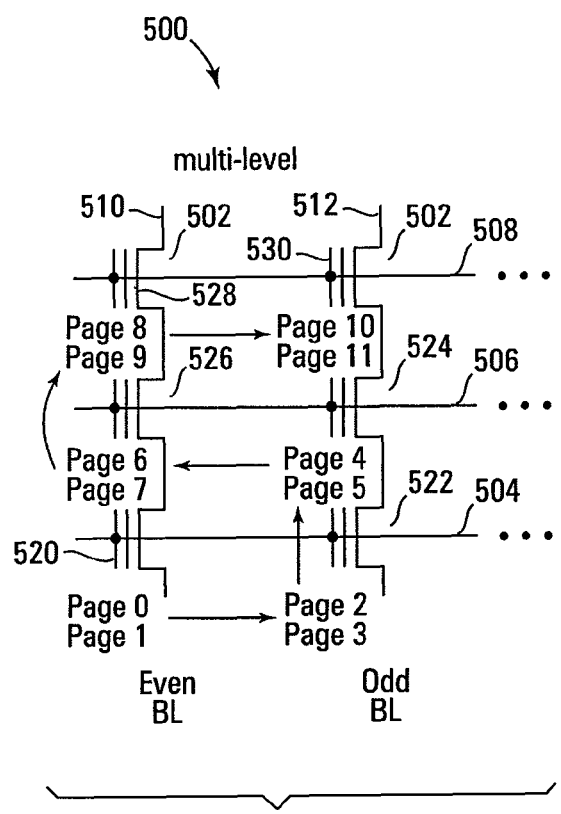
FIGS. 5A-5C detail programming operations in a non-volatile memory array utilizing multi-level cells and having multiple pages per row in accordance with embodiments of the present invention.
Figure 5B:
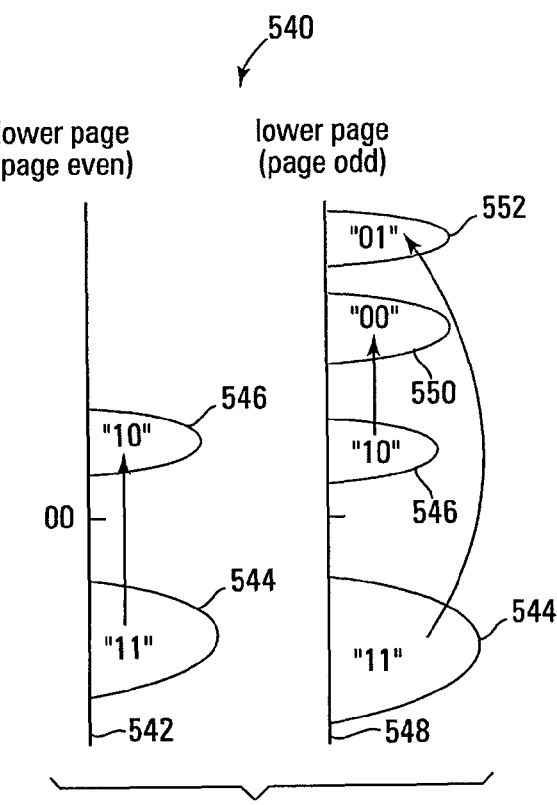

FIG. 5A illustrates an example of a programming operation in a multi-level cell (MLC) non-volatile memory array 500 having multiple pages per row utilizing coupling compensation in accordance with an embodiment of the present invention. In FIG. 5, the array 500 contains MLC non-volatile memory cells 502 that store 2-bits of data per cell arranged in rows 504, 506, 508 and columns 510, 512 and having four pages (two pages on each memory cell 502 on the even bit lines 510 and two pages on each memory cell 502 on the odd bit lines 512) in each row. The pages are written in sequential fashion, such that a first page is written into a group of memory cells of the row (writing the first bit into each cell), before the threshold voltages of the group of memory cells are altered yet again to write a second page into the group of memory cells (writing the second bit into each cell) in two separate write operations, before moving on to another group of memory cells of the row to write a third and fourth pages of data, and so on. This write sequence is detailed in threshold voltage transitions 540 in FIG. 5B. In FIG. 5B, the lower page data 542 is written into a memory cell 502, programming the memory cell to the threshold voltage level representing logic state "10" 546 or inhibiting the memory cell and leaving the memory in the erased logic state of "11" 544. The upper page data 548 is then written into the memory cell 502. If the second page data is logical "0", programming the memory cell to either the threshold voltage level representing logic state "00" 550 or the threshold voltage level representing logic state "01" 552 depending on if the stored first page data is logical state "11" or "10". If the second page data is logical "1", inhibiting the memory cell and leaving the memory in the erased logic state of "11" 544 or logic state "10" 546, again depending on if the stored first page data at logical state "11" or "10". It is noted that in another embodiment of the present invention the pages stored in a group of MLC memory cells are written into the memory cells in a single write operation (writing the first and second bits into each cell at the same time).

As there are multiple pages contained in each row, major coupling interference effects can occur in both within the row (the X-axis) and in the column (from row to row, or Y-axis), as with the SLC embodiment of FIG. 4. The page address/programming sequence of the memory array embodiment 500 of FIG. 5 transitions in an alternating "S" pattern between the even bit line 510 and the odd bit line 512 so that the next memory cell to be sequentially addressed/programmed is always directly adjacent to the previously addressed/programmed cell. For example, Pages 0 and 1 520 (Even BL 510, WLN 504), Pages 2 and 3 522 (Odd BL 512, WLN 504), Pages 4 and 5 524 (Odd BL 512, WLN+1 506), Pages 6 and 7 526 (Even BL 510, WLN+1 506), Pages 8 and 9 528 (Even BL 510, WLN+2 508), Pages 10 and 11 530 (Odd BL 512, WLN+2 508), etc. As with the SLC array 400 embodiment of FIG. 4, it is again noted that in multiple page per row embodiments of the present invention, coupling interference can also be compensated multiple write operations out/pages out. However, again, this requires increased circuit complexity and additional input buffer/data latch space.

Figure 5C:
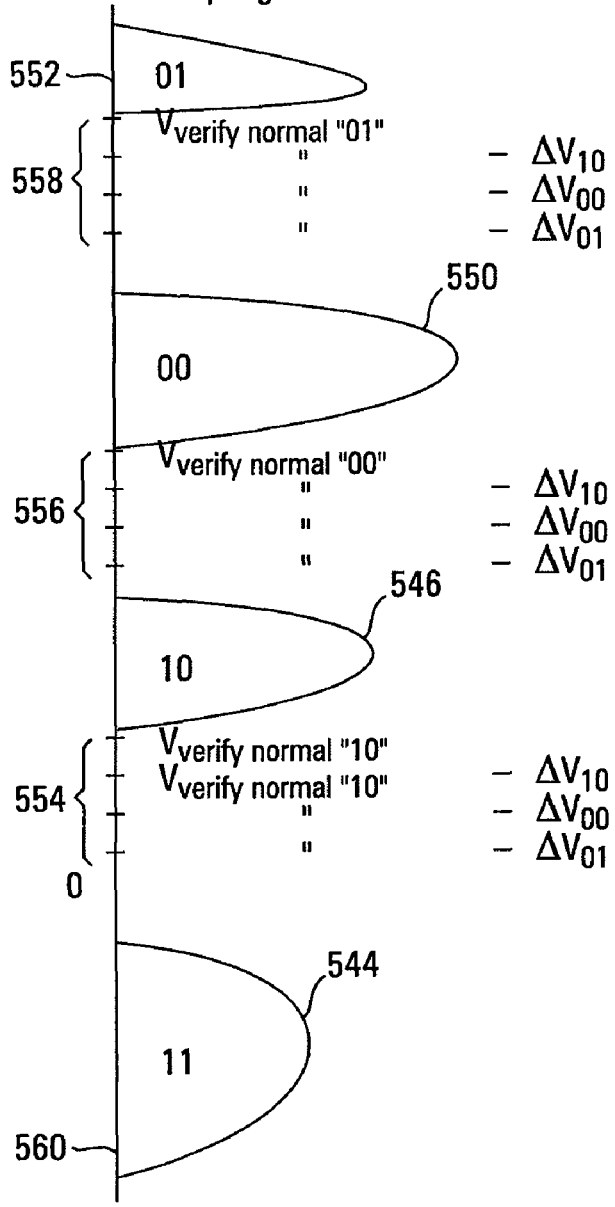

FIG. 5C details the threshold voltage ranges 560 and the adjustment of the programmed state threshold voltages 554, 556, and 558 of the multi-level memory cells (MLCs) 502 of the memory array 500 embodiment of FIG. 5A. In FIG. 5C, memory cells 502 are initially erased into the erased threshold voltage state 544 (logical state "11", a slightly negative voltage). When programmed the final programmed threshold voltages of a group of memory cells 302 containing two or more pages of data are altered to a threshold voltage in ranges 554, 556, and 558, to compensate them, depending on whether a directly adjacent (or non-directly adjacent) memory cell 502 of the current row 504 or following row 506 is also to be programmed to one of the allowed programmed states in a following programming operation. The threshold voltage of the programmed cell is determined by consulting the ΔVth matrix 570 of FIG. 5C, that utilizes the final programmed threshold voltages of the memory cell 502 and the adjacent memory cell to determine the coupling compensated threshold voltage to program into the memory cell, compensating for the coupling interference and inadvertent charge injection.

Figure 6:
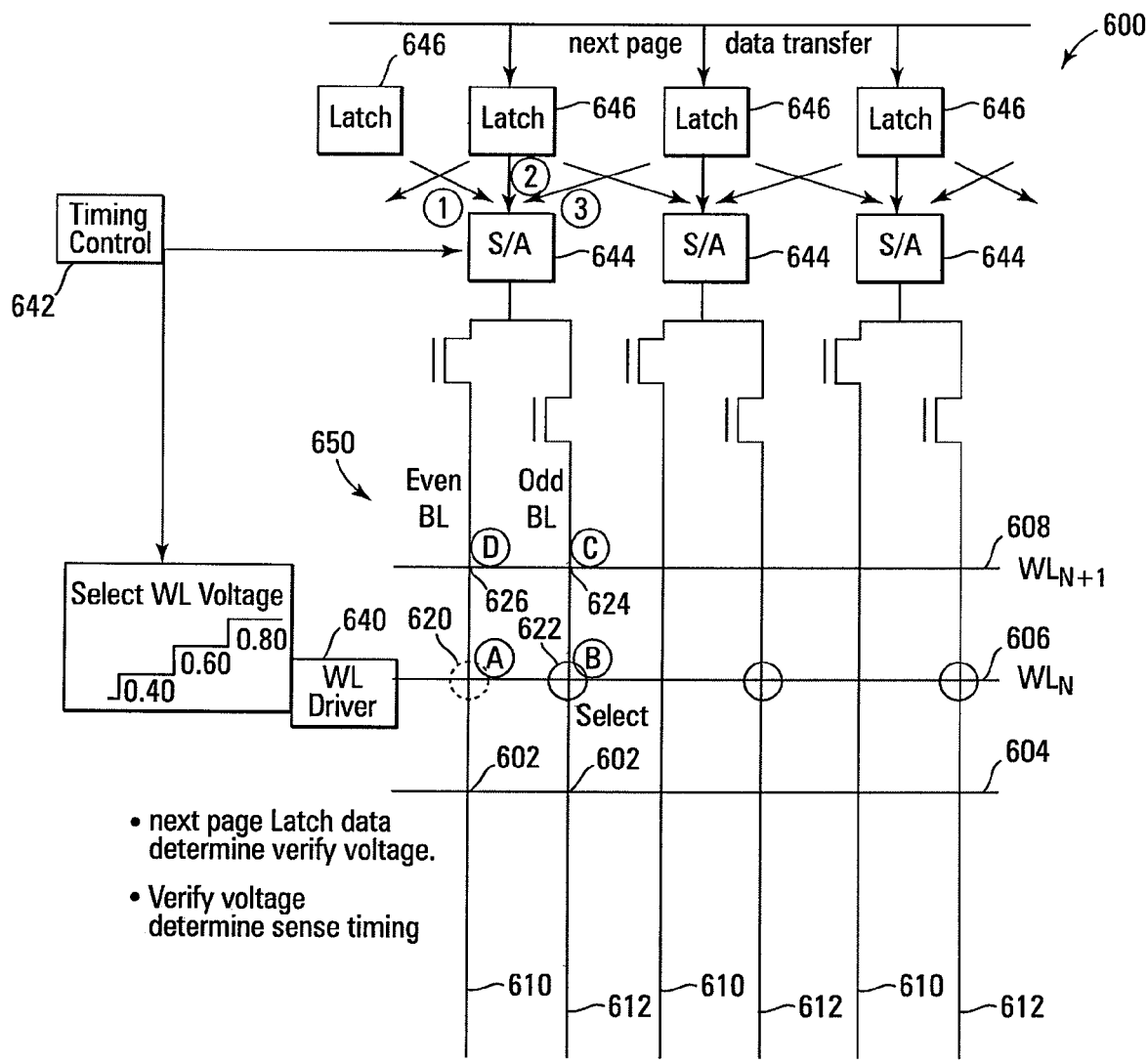
FIG. 6 details another programming operation in a non-volatile memory array utilizing multi-level cells and having multiple pages per row in accordance with embodiments of the present invention.

FIG. 6 illustrates another example of a programming operation in a NAND architecture non-volatile memory device 600 having multiple pages per row utilizing coupling compensation in accordance with another embodiment of the present invention. In FIG. 6, the memory device 600 contains an array 650 of non-volatile memory cells 602 (represented here by the intersection of each bit line and word line) arranged in rows 604, 606, 608 and columns 610, 612 and having two pages (a page on the even bit lines 610 and a page on the odd bit lines 612) in each row 604, 606, 608. Data to be written is latched into data latches 646 of the memory device 600 after being transferred in from the memory bus. A current row of data is then transferred from the data latches 646 to the sense amplifiers 644. The row 604, 606, 608 and the page of the row to be written are selected from the decoded row address (not shown) and the even bit line 610 or odd bit line 612 coupled to each sense amplifier 644. The next page of data to be written is also latched at this time into the data latches 646. The timing control 642 selects the timing of the sense amplifiers 644 and/or programming word line voltage delivered by the word line driver 640 to program the selected memory cells 602 of the page of the memory array 650. In doing so, the timing control 642 utilizes the next page data stored in the data latches 646 to select and compensate the threshold voltage levels of the current page of data for the coupling effects predicted from the programming of the next page of data.

The page address/programming sequence of the memory array embodiment 600 of FIG. 6 again transitions in an alternating "S" pattern between the even bit line 610 and the odd bit line 612 so that the memory cells of the next page to be sequentially addressed/programmed are always directly adjacent to those of the previously addressed/programmed page (sequentially writing the pages of the row from the first page to the last page and then reversing and writing the last to first page of the next row, and so on); Page A 620 (Even BL 610, WLN 604), Page B 622 (Odd BL 612, WLN 604), Page C 624 (Odd BL 612, WLN+1 606), Page D 626 (Even BL 610, WLN+1 606). In compensating Page A 620, the latch data contained in both the latch 646 (2) directly coupled to the sense amplifier 644 programming the cell and that of the latch 646 (1) programming the cell adjacent to the immediate left is utilized. In compensating Page B 622, the latch data contained only in the latch 646 (2) directly coupled to the sense amplifier 644 is utilized. In compensating Page C 624, the latch data contained in both the latch 646 (2) directly coupled to the sense amplifier 644 and that of the latch 646 (3) adjacent to the immediate right is utilized. In compensating Page D 624, the latch data contained only in the latch 646 (2) directly coupled to the sense amplifier 644 is utilized.

As will be apparent to one skilled in the art, differing word line voltages, compensated threshold voltages, and patterns can be set in embodiments of the present invention to compensate for a variety of different memory cell to memory cell coupling ratios, memory cell geometry, word line characteristics, program speeds or interference susceptibilities.

Figure 7:
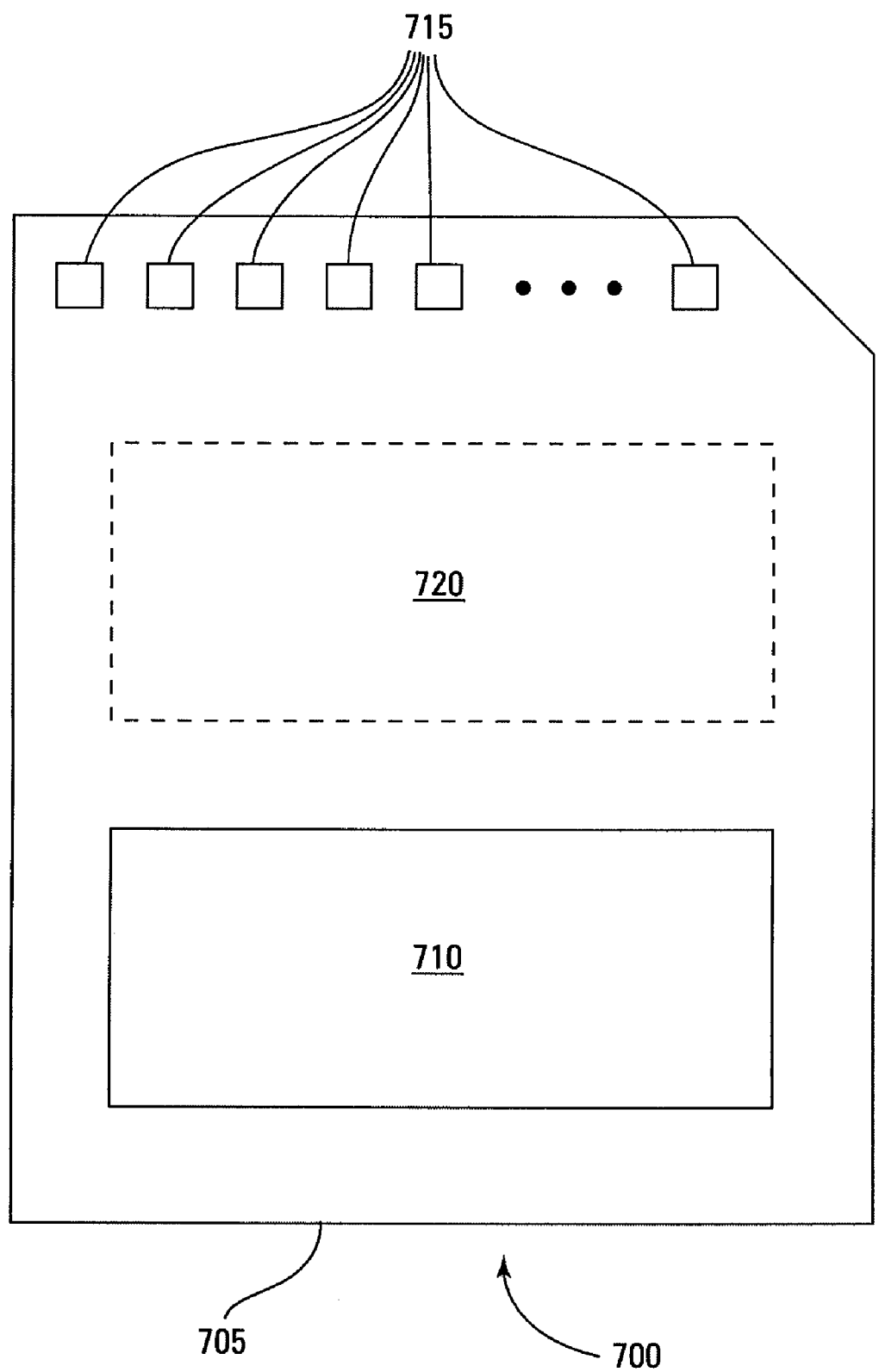
FIG. 7 is a simplified block diagram of a memory module in accordance with an embodiment of the present invention.

FIG. 7 is an illustration of an exemplary memory module 700. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory including circuits of or adapted to perform elements of methods of the present invention. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

It is noted that other programming operations and threshold voltage levels for non-volatile memory device and array embodiments of the present invention are possible and will be apparent for those skilled in the art with the benefit of this disclosure.

CONCLUSION

A non-volatile memory device and programming process has been described that compensates for the capacitive coupling effects on programmed threshold gate voltages of adjacent floating gate or non-conductive floating node memory cells by adjusting the threshold voltage level programmed into a memory cell in view of the coupling ratio and the data/threshold value being programmed on a following programming cycle into an adjacent memory cell, so that the coupling effect between the cells results in the desired target threshold voltages for the cells. In one embodiment of the present invention, memory cell to memory cell coupling is compensated for by adjusting programming level of one or more memory cells of a first page or row of a memory array or non-volatile memory device to a higher or lower threshold verify target voltage given the data/programming level to be written to directly adjacent memory cells of a second page, so that coupling between the directly adjacent memory cells of the first and second pages brings the one or more memory cells of first page to their final target programming level.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a selected memory cell of an array of memory cells to a desired programming state, the method comprising:
adjusting the desired programming state to an adjusted programming state, wherein the adjusted programming state comprises a programming state where the selected memory cell achieves the desired programming state in response to coupling effects resulting from a subsequent programming operation performed on a first memory cell adjacent to the selected memory cell.

2. The method of claim 1, wherein a subsequent programming operation performed on the first memory cell adjacent to the selected memory cell further comprises a subsequent programming operation performed on the first memory cell where the first memory cell is adjacent the selected memory cell by a row of the array of memory cells.

3. The method of claim 1, wherein a subsequent programming operation performed on the first memory cell adjacent to the selected memory cell further comprises a subsequent programming operation performed on the first memory cell where the first memory cell is adjacent the selected memory cell by a column of the array of memory cells.

4. The method of claim 1, wherein adjusting the desired programming state to an adjusted programming state further comprises, adjusting the desired programming state to an adjusted programming state where the selected memory cell achieves the desired programming state due to coupling effects resulting from a subsequent programming operation performed on a second memory cell adjacent to the selected memory cell.

5. The method of claim 4, further comprising programming the selected memory cell to the adjusted programming state prior to programming the second memory cell adjacent to the selected memory cell.

6. The method of claim 5, wherein the subsequent programming of the first memory cell and the second memory cells further comprises the subsequent programming of the first memory cell and the second memory cell as part of a programming operation of a page of memory cells.

7. A method of programming memory cells of a memory array, the method comprising:
receiving first data to be written in a first memory cell;
receiving second data to be written in a second memory cell, wherein the second memory cell is adjacent the first memory cell and where the first and the second data each corresponds to one of a plurality of programming levels to be programmed in the first and the second memory cells;
determining a plurality of adjustment amounts, wherein each adjustment amount of the plurality of adjustment amounts corresponds to one of the plurality of programming levels;
adjusting the first data by an adjustment amount corresponding to a programming level of the received second data; and
programming the first memory cell with the adjusted first data prior to programming the second memory cell.

8. The method of claim 7, wherein determining a plurality of adjustment amounts further comprises determining a plurality of adjustment amounts where each adjustment amount compensates for coupling effects resulting from a programming operation of a particular programming level to be performed on the second memory cell of the memory array.

9. The method of claim 7, wherein adjusting the first data further comprises adjusting the first data by one of the plurality of adjustment amounts such that the first memory cell achieves a programming level corresponding to the received first data upon completion of subsequently programming the second memory cell with the second data.

10. A method of compensating for programming interference effects in a memory device comprising an array of memory cells, the method comprising:
characterizing a first coupling ratio between a first plurality of memory cells and a second plurality of memory cells of the array of memory cells where the first plurality of memory cells are adjacent the second plurality of memory cells in the array of memory cells;
receiving first data to be programmed into the first plurality of memory cells;
receiving second data to be programmed into the second plurality of memory cells;
adjusting the first data to be programmed into each of the first plurality of memory cells by an amount dependent upon the second data to be programmed into an adjacent memory cell of the second plurality of memory cells and further dependent upon the first characterized coupling ratio; and
programming the first plurality of memory cells with the adjusted first data prior to programming the second plurality of memory cells.

11. The method of claim 10, further comprising characterizing a second coupling ratio between the first plurality of memory cells and a third plurality of memory cells of the array where the first plurality of memory cells are adjacent the third plurality of memory cells in the array of memory cells, and receiving third data to be programmed into the third plurality of memory cells.

12. The method of claim 11, wherein adjusting the first data to be programmed into each of the first plurality of memory cells further comprises adjusting the first data to be programmed into each of the first plurality of memory cells where adjusting the first data is further dependent upon the second characterized coupling ratio and the third data to be programmed in each adjacent memory cell of the third plurality of memory cells.

13. The method of claim 12, wherein programming the first plurality of memory cells with the adjusted first data further comprises programming the first plurality of memory cells with the adjusted first data prior to programming the third plurality of memory cells.

14. The method of claim 10, wherein characterizing a first coupling ratio between a first plurality of memory cells and a second plurality of memory cells of the array of memory cells further comprises characterizing a first coupling ratio between a first plurality of memory cells and a second plurality of memory cells of the array of memory cells during manufacturing of the memory device.

15. The method of claim 10, wherein characterizing a first coupling ratio between a first plurality of memory cells and a second plurality of memory cells further comprises characterizing a first coupling ratio between a first plurality of memory cells and a second plurality of memory cells where the first and the second pluralities of memory cells comprise multi-level memory cells.

16. A method of programming memory cells of an array of memory cells, the method comprising:
receiving a first data value to be programmed into a first memory cell, the first data value corresponding to a first range of threshold voltages;
receiving a second data value to be programmed into a second memory cell, the second data value having a corresponding range of threshold voltages, and where the second memory cell is adjacent to the first memory cell; and
programming the first memory cell to a first adjusted threshold voltage outside of the first range of threshold voltages to compensate for interference by the subsequent programming of the second data value into the second memory cell.

17. The method of claim 16, further comprising receiving a third data value to be programmed into a third memory cell the third data value having a corresponding range of threshold voltages, and where the third memory cell is adjacent to the second memory cell.

18. The method of claim 17, further comprising programming the second memory cell to a second adjusted threshold voltage outside of the second range of threshold voltages to compensate for interference by the subsequent programming of the third data value into the third memory cell.

19. The method of claim 18, further comprising receiving a fourth data value to be programmed into a fourth memory cell the fourth data value having a corresponding range of threshold voltages, and where the fourth memory cell is adjacent to the first and the third memory cells.

20. The method of claim 19, further comprising programming the third memory cell to a third adjusted threshold voltage outside of the third range of threshold voltages to compensate for interference by the subsequent programming of the fourth data value into the fourth memory cell.

* * * * *